United States Patent [19]

Yamasita et al.

[11] Patent Number: 5,478,681
[45] Date of Patent: * Dec. 26, 1995

[54] METHOD FOR PRODUCING COLOR FILTER

[75] Inventors: Yukio Yamasita, Yokohama; Haruyoshi Sato, Kawasaki; Toru Nakamura, Yokohama; Hitoshi Yuasa, Yokohama; Yutaka Otsuki, Yokohama, all of Japan

[73] Assignee: Nippon Oil Co., Ltd., Tokyo, Japan

[ * ] Notice: The portion of the term of this patent subsequent to May 25, 2010, has been disclaimed.

[21] Appl. No.: 152,870

[22] Filed: Nov. 10, 1993

[51] Int. Cl.$^6$ ............................... G03F 5/00; G03F 7/12
[52] U.S. Cl. ............................... 430/7; 430/293; 430/294; 430/321; 430/329; 430/330
[58] Field of Search ........................... 430/7, 293, 294, 430/321, 329, 330

[56] References Cited

U.S. PATENT DOCUMENTS

| | | | |
|---|---|---|---|
| 4,522,691 | 6/1985 | Suginoya et al. | 204/18.1 |
| 4,808,501 | 2/1989 | Chiulli | 430/330 |
| 4,812,387 | 3/1989 | Suzuki et al. | 430/321 |
| 4,902,592 | 2/1990 | Matsumura et al. | 430/7 |
| 5,008,166 | 4/1991 | Aoki | 430/321 |
| 5,147,743 | 9/1992 | Grossa | 430/330 |
| 5,186,801 | 2/1993 | Matsumura et al. | 430/7 |
| 5,214,541 | 5/1993 | Yamasita et al. | 430/7 |
| 5,214,542 | 5/1993 | Yamasita et al. | 430/7 |
| 5,246,816 | 9/1993 | Yamasita et al. | 430/7 |
| 5,314,769 | 5/1994 | Yamasita et al. | 430/7 |
| 5,314,770 | 5/1994 | Yamasita et al. | 430/7 |
| 5,334,468 | 8/1994 | Yamasita et al. | 430/7 |
| 5,385,795 | 1/1995 | Yuasa et al. | 430/7 |
| 5,399,449 | 3/1995 | Tanimuro et al. | 430/7 |
| 5,422,207 | 6/1995 | Yoda et al. | 430/7 |

FOREIGN PATENT DOCUMENTS

| | | | |
|---|---|---|---|
| 0525465 | 2/1993 | European Pat. Off. | 430/321 |
| 9114572 | 7/1984 | Japan . | |
| 3017622 | 1/1991 | Japan | 430/293 |

Primary Examiner—Charles L. Bowers, Jr.
Assistant Examiner—J. Pasterczyk
Attorney, Agent, or Firm—Darby & Darby

[57] ABSTRACT

A method for producing a color filter comprising exposing a portion of the color filter corresponding to colored portions through a different pattern mask by colors and in an irradiation dose varying for each mask to effect patterning and successively coloring the pattern portions smaller or larger in the order of light irradiation dose by way of development and electrodeposition.

40 Claims, 3 Drawing Sheets

5,478,681

METHOD FOR PRODUCING COLOR FILTER

BACKGROUND OF THE INVENTION

This invention relates to a method for producing a color filter and more particularly to a color filter suitable for use in a color liquid crystal display device or the like.

Methods For producing color filters generally used at present involve a dyeing method, a printing method, a pigment dispersion method, etc. wherein a transparent substrate is colored with a binder containing dyes pigments.

Since the dyeing method consists in selectively dying a thin film of a resin on a substrate with dyes, however, a resist printing process and a photolithographic process need to be performed each time the color is changed. Although resist printing is unnecessary with the above printing method, there is a limit to refinement of color patterns and, the larger is the number of colors, the precision of printing position becomes the worse. Although a fine color pattern is possibly obtainable with the pigment dispersion method, a high precision photolithographic process needs to be performed each time the color is changed, thus making the process extremely complicate.

For overcoming these deficiencies, there is proposed in Japanese Laid-open Patent Application No. Sho 59-114572 a method for producing a color filter by an electrodeposition coating method. With this method, a transparent electrode is prepared by patterning a transparent electrically conductive film deposited on the substrate, immersing the substrate in a colored electrodeposition bath, and applying electrical voltage only to a portion of the patterned transparent electrode to be dyed in the same color for forming a colored layer by electrodeposition. The substrate is then immersed in a different colored electrodeposition bath and electric voltage is then applied only to a portion of the substrate to be dyed in a different color for forming a different color layer by electrodeposition. In this method, however, it is necessary to first perform a high precision patterning of the transparent electrode, paying meticulous care to the patterned transparent electrode during the subsequent treatment. If part of the fine pattern should be broken, the subsequent coloring process is rendered difficult making production undesirable. Besides, the patterned transparent electrode needs to be electrically continuous, even in fine pattern sections, so that limitations are imposed on the degree of freedom of the pattern shape.

SUMMARY OF THE INVENTION

It is an object of the present invention to overcome the aforementioned drawbacks and provide a method for producing a color filter which needs no high precision fine processing and which has a large degree of freedom in selecting any kind of patterns of the colored layers so that it is easy to cope with the demand for a larger picture size and easy for mass-production.

In accordance with the present invention, there is provided a method for producing a color filter comprising the steps of:

(A) forming a negative type photosensitive coating film on a transparent substrate having a transparent electrically conductive layer on the surface thereof and exposing the film separately through at least two negative pattern masks in such manner that each pattern mask is different in light irradiation dose, and (B) developing and removing the photosensitive coating film and repeating an operation of applying a colored coating by electrodeposition onto the exposed electrically conductive layer to form a colored layer successively for the respective pattern regions in the order in which the light irradiation dose increases.

In accordance with the present invention, there is also provided a method for producing a color filter comprising the steps of:

(A') forming a positive type photosensitive coating film on a transparent substrate having a transparent electrically conductive layer on the surface thereof and exposing the film separately through at least two positive pattern masks in such manner that each pattern mask is different in light irradiation dose, and (B') developing and removing the photosensitive coating film and repeating an operation of applying a colored coating by electrodeposition onto the exposed electrically conductive layer to form a colored layer successively for the respective pattern regions in the order in which the light irradiation dose decreases.

PREFERRED EMBODIMENT OF THE INVENTION

Figure 1:
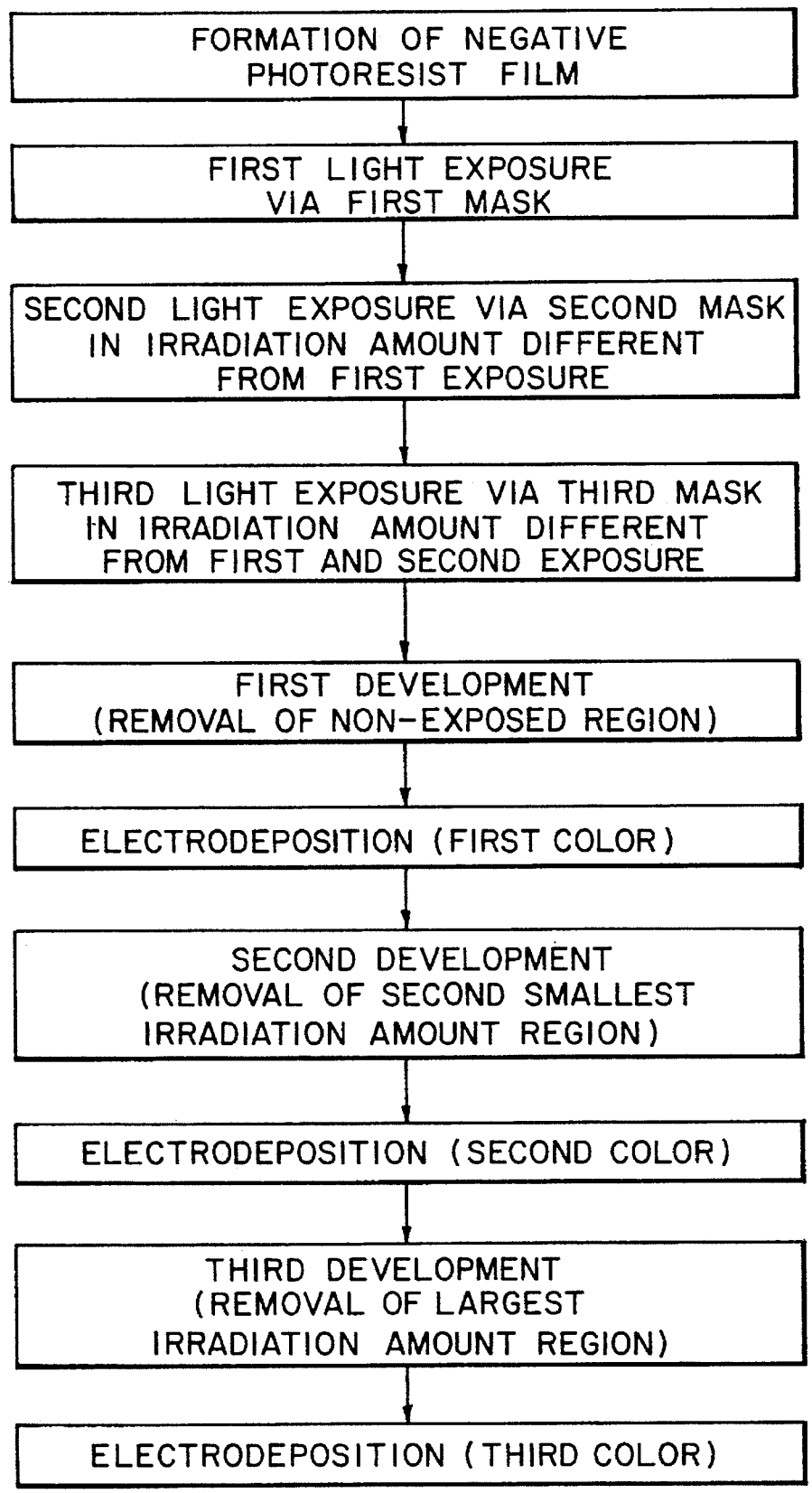
FIG. 1 is a flow chart showing an embodiment of the present invention.

The present invention will now be explained in more detail.

In the present invention, a negative type photosensitive coating film is firstly formed on a transparent substrate having a transparent electrically conductive layer on the surface thereof and the film is exposed to light separately through at least two different negative pattern masks in such manner that each negative pattern mask is different in light irradiation dose [referred to hereinafter as the step (A)]. Alternatively, a positive type photosensitive coating film is formed on a transparent substrate having & transparent electrically conductive layer on the surface thereof and the film is exposed to light separately through at least two different positive pattern masks in such manner that each positive pattern mask is different in light irradiation dose [referred to hereinafter as the step (A')].

There is no particular limitation to the transparent substrate having a transparent electrically conductive layer on its surface used in the present invention, if the substrate is a transparent plate having an electrically conductive layer on its surface. Examples of the substrate may include a glass plate, a plastic plate or other plate-like materials having a transparent electrically conductive layer on its surface. The substrate preferably has a smooth surface in view of the performance desired of a color filter. The surface of the substrate may be ground if so required.

The electrically conductive layer may be formed of such materials containing as a component tin oxide, indium oxide, antimony oxide, etc. There is no particular imitation to the methods for forming an electrically conductive layer and any of the known methods such as spraying, chemical vapor deposition (CVD), sputtering or vacuum evaporation, may be employed. A commercially available transparent substrate having a transparent electrically conductive layer may also be employed. The substrate is preferably as highly transparent as possible, in view of the performance desired of the color filter.

Although there is no particular limitation to the method of forming the negative or positive type photosensitive coating film on the transparent substrate, a photosensitive coating may be applied on the substrate by known methods, such as electrodeposition, spraying, dip coating, roll coating, screen printing or spin coating.

As the photosensitive coating for forming the negative type photosensitive coating film employed for the step (A), a resin exhibiting film-forming ability and photosensitivity (referred to hereinafter as the photosensitive coating resin) and a coating material having dispersed or dissolved a photopolymerization initiator, if necessary, with a dye and/ or a pigment in an organic solvent or water. Dyes and/or pigments may or may not be contained in the photosensitive coatings. When the photosensitive coating contains a dye and/or a pigment to be a constituent of the color filter aimed at, the number of repetition of the below-mentioned step (B) can be omitted by one time.

The photosensitive coating resin preferably employed in the present invention may include a prepolymer or a resin having photosensitive groups such as (meth)acryloyl groups, e.g. acryloyl or methacryloyl group and/or cinnamoyl groups at a terminal and/or side chain of the molecule and having a molecular weight ranging between 500 and 10,000.

Illustrative of the prepolymer or resin are, for example, a prepolymer such as epoxy (meth)acrylate, urethane (meth-)acrylate or polyester (meth)acrylate; a caution resin such as an acrylic resin, epoxy resin, urethane resin or polybutadiene resin into which amino group or an onium group such as ammonium or sulfonium has been introduced and which has been solubilized and/or dispersed in water with an acid such as formic acid, acetic acid, propionic acid or lactic acid or an acidic substance; and an anionic resin such as an acrylic resin, polyester resin, maleinated oil resin, polybutadiene resin or epoxy resin into which a carboxylic acid group or the like and the above mentioned photosensitive group have been introduced and which has been solubilized and/or dispersed in water with a basic substance such as triethylamine, diethylamine, dimethylethanolamine or ammonia. The use of the prepolymers or resins that may be solubilized and/or dispersed in water is most preferred for simplifying the process and combating pollution.

The photosensitive coating resins may also be admixed with low molecular (meth)acrylates for controlling photosensitive properties and viscosity of the coating film. Examples of such (meth)acrylates include 2-hydroxyethyl (meth)acrylate, 2-phenoxyethyl (meth)acrylate, 3-phenoxy-2-hydroxypropyl (meth)acrylate, 2-ethylhexyl (meth)acrylate, tricyclodecane (meth)acrylate, hexanediol (meth)acrylate, trimethylolpropane triacrylate, pentaerythritol triacrylate, dipentaerythritol hexacrylate, and tris(acryloyloxyethyl) isocyanurate. They may be used as a mixture. The proportion of these (meth) acrylates is preferably 0–50 and most preferably 0–30 parts by weight to 100 parts by weight of the photosensitive coating resin. If the proportion of the (meth)acrylates exceeds 50 parts by weight, the coating becomes undesirably tacky.

The photopolymerization initiator may be any of those known in the art and may be enumerated by benzoins, benzoin ethers, benzylalkyl ketals, benzophenone derivatives, anthraquinone derivatives and thioxanthone derivatives. Sensitizers may be added thereto if so desired. The photopolymerization initiator may be added in an amount of 0.1 to 30 and preferably 0.5 to 20 parts by weight to 100 parts by weight of the photosensitive coating resin. If the amount of the initiator is less than 0.1 part by weight, photocuring properties fall short, whereas, if it exceeds 30 parts by weight, curing proceeds excessively and hence the coating film becomes poor in strength, while economic advantages are also lost.

The organic solvent used for dispersing or dissolving the components of the photosensitive coating may be any of those capable of dissolving the above mentioned prepolymers or resins. Examples of the solvents include glycol ethers, such as ethyleneglycol monobutyl ether, ethyleneglycol monohexyl ether, ethyleneglycol monophenyl ether, propyleneglycol monomethyl ether, propyleneglycol monophenyl ether, diethyleneglycol dimethyl ether and triethyleneglycol dimethyl ether; ketones such as acetone, methyl ethyl ketone, methyl isobutyl ketone, cyclohexanone and isophorone; ethers such as dibutyl ether, dioxane and tetrahydrofuran; alcohols such as methoxybutanol, diacetone alcohol, butanol and isopropanol; hydrocarbons such as toluene, xylene and hexane; esters such as ethyl acetate, butyl acetate, 2-methoxyethyl acetate and 2-methoxypropyl acetate. On actual use, they may be used singly or as a mixture.

These organic solvents may be added during solubilization or dispersion in water of the above mentioned cationic or anionic resins for facilitating the solubilization or dispersion, improving stability of the electrodeposition bath of obtaining smooth coating films.

The hue of the dyes and/or pigments mixed at need with the photosensitive coating may be selected freely depending on objects, but it is preferable to use a darker color hue, especially the hue of black, deep navy blue, deep violet or deep brown is preferable for preventing any light leakage.

The dyes and/or the pigments are preferably so selected as not to lower the stability and occasionally electrodeposition properties as well as durability of the coating. For this reason, oil-soluble or -dispersible dyes, specifically, those of azo, anthraquinone, benzodifuranone and condensed methine series are preferred. The pigments may be exemplified, for example, by organic pigments, such as azo lake pigments, quinacridone pigments, phthalocyanine pigments, isoindolinone pigments, anthraquinone pigments and thioindigo pigments; and inorganic pigments such as chrome yellow, iron oxide, chrome vermilion, chrome green, ultramarine, prussian blue, cobalt blue, cobalt green, emerald green and carbon black. Two or more of the dyes and/or pigments may be used as a mixture unless they damage their characteristics. As for the color hue of the dyes and pigments, reference is had to "COLOUR INDEX" whenever necessity arises.

The proportion of the dyes and/or pigments is suitably selected depending on the application, color hue, the type of the dyes and/or the pigments used or the film thickness of the photosensitive coating. The proportion may preferably be 3–70 wt. % and more preferably 5–60 wt. % based on the total photosensitive coating.

Depending on the sort and proportion of the dyes and/or pigments, the coating film produced may be rendered light-transmitting or light-intercepting according to the intended object. For example, a blackish light-intercepting coating film can be obtained by using carbon black or the like as pigment in an amount of 3–50% by weight based on the total amount of the photosensitive coating. The blackish light-intercepting coating film is particularly preferable for the purpose of preventing any light leakage. Further, white color is also involved in the tint of dyes and/or pigments. Furthermore, it is preferable to use dyes and/or pigments after being purified to eliminate any impurities for obtaining a coating film of good quality. The photosensitive coating may also be incorporated with a dispersion assistant for dyes and/or pigments and with various auxiliary agents such as leveling agents for improving smoothness of the coating film, viscosity-adjusting agents and defoamants and the like.

For preparing the photosensitive coating, the photosensitive coating resins, the photopolymerization initiator, the organic solvent and/or water, if necessary, with dyes and/or pigments, acidic or basic materials, dispersion assistants for dyes and/or pigments, leveling agents for improving smoothness of the coating film, viscosity-adjusting agents, defoamants and the like various auxiliary agents are mixed and sufficiently dispersed, using a dispersion apparatus, such as customary sand mills, roll mills or attriters. There is no limitation to the film thickness of the photosensitive coating films thus formed by the photosensitive coating and the film thickness may be suitably selected depending on the performance desired of the color filter. The dry film thickness may be usually 0.3 to 5 μm and preferably 1 to 3 μ. The film thickness may be adjusted by controlling, for example, electrodeposition conditions, such as voltage, electrodeposition time and bath temperature, if the photosensitive coating film is formed by way of electrodeposition. However, film thickness adjustment may be usually made under the same conditions as those for electrodeposition coating of colored coatings, as will be explained subsequently.

In case the photosensitive coating film is not used as a colored film, it is preferable that the coloring agents be not added to the film and the film thickness be as thick as 0.3–5 μm preferably 1–3 μm to reduce the curing-inhibitor action due to oxygen and to prevent the formation of pinholes, etc.

A coating prepared by dispersing or dissolving a resin having film-forming ability and photosensitivity (referred to hereinafter as the positive type photosensitive coating resin) and, if necessary, with dyes and/or pigments dispersed or dissolved in an organic solvent or water can be mentioned as the positive type photosensitive coating for forming the positive type photosensitive coating film used in the step (A'). In case the positive type photosensitive coating capable of being electrodeposited is selected here, the step (A) may be carried out according to the electrodeposition process.

The positive type photosensitive coating may or may not contain dyes and/or pigments, etc.

There is no particular limitation to the positive type photosensitive coating resin, if an exposed portion thereof is dissolved in a developing solution. Preferable examples of the coating resin include resins containing quinonediazido groups, resins including diazomeldrums acid or nitrobenzyl ester, or resin compositions including these resins. Specific examples of these resins include a quinonediazido group-containing cationic resin composition in which amino groups or onium groups such as ammonium or sulfonium and hydroxyl groups have been introduced, for example, into acrylic resin, epoxy resin, urethane resin or polybutadiene resin, to which a quinonediazidesulfonic acid compound has been added further by an esterification reaction followed by having been solubilized and/or dispersed in water with an acid such as formic acid, acetic acid, propionic acid or lactic acid or an acidic substance; a quinonediazido group-containing anionic resin in which carboxyl groups and hydroxyl groups have been introduced into acrylic resin, polyester resin, maleinated oil resin, polybutadiene resin or epoxy resin, to which a quinonediazidesulfonic acid compound has further been added by an esterification reaction followed by having been solubilized and/or dispersed in water with a basic substance such as triethylamine, diethylamine, dimethylethanolamine or ammonia; and a composition obtained by reacting a resin having film-forming capability and a compound having hydroxyl groups with a quinonediazidesulfonic acid derivative and properly blending the produced resins. The use of resins that may be solubilized and/or dispersed in water are preferred for simplifying the process and preventing pollution. The mixing ratio for the resin compositions may optionally be selected according to light exposure and development conditions.

In addition to these, a positive type photoresist can also be used which comprises as indispensable components a compound containing a group capable of forming an alkali- or water-soluble group by an acid catalyst and an acid-generating agent by light.

The organic solvent used for dispersing or dissolving the components of the positive type photosensitive coating resins may be any of those capable of dispersing or dissolving the above mentioned resins. Examples of the solvents include various glycol ethers, such as ethyleneglycol monobutyl ether, ethyleneglycol monohexyl ether, ethyleneglycol monophenyl ether, propyleneglycol monomethyl ether, propyleneglycol monophenyl ether, diethyleneglycol dimethyl ether and triethyleneglycol dimethyl ether; ketones such as acetone, methyl ethyl ketone, methyl isobutyl ketone, cyclohexanone, isophorone and N-methylpyrrolidone; ethers such as dibutyl ether, dioxane and tetrahydrofuran; alcohols such as nethoxybutanol, diacetone alcohol, butanol, octanol and isopropanol; hydrocarbons such as toluene, xylene, cyclohexane and hexane; esters such as ethyl acetate, butyl acetate, 2-methoxyethyl acetate, 2-methoxypropyl acetate and ethyl benzoate; acid amides such as dimethylformamide, N,N-dimethylacetoamide and dimethyl sulfoxide. On actual use, they may be used singly or as a mixture.

These organic solvents may be added during solubilization and/or dispersion in water of the above mentioned cationic or anionic resins for facilitating the solubilization or dispersion, improving stability of the bath or obtaining smooth coating films.

If necessary, the positive type photosensitive coating may be incorporated with dyes and/or pigments. The hue of the dyes and/or pigments may be selected freely depending on objects, if so desired. For example, in order to improve resolution of the positive type photosensitive coating, it is preferred to incorporate dyes absorbing light having wavelength of 400 to 500 nm such as oil yellow or a UV-absorbing agent, e.g. trihydroxybenzophenone to remove light having broad wavelength which exhibits large diffraction upon exposure. Two or more dyes and/or pigments ay be mixed to obtain desired hue unless their characteristics are impaired.

The proportion of the dyes and/or the pigments is suitably selected depending on the application, color hue, the type of the dyes and/or the pigments or the film thickness of the positive type photosensitive coating at the time of dryling. The proportion may preferably be 0.01 to 10 wt. % and more preferably 0.5 to 5.0 wt. % based on the total positive type photosensitive coating.

The above positive type photosensitive coating can obtained by mixing the positive photosensitive coating resin with an organic solvent and/or water, if necessary, various auxiliary agents such as dyes and/or pigments, acidic or basic substances, dispersion assistants for the dyes or pigments, leveling agents for improving smoothness or the coating, viscosity-adjusting agents, and defoaming agents and well dispersing these using a generally used dispersion device such as a sand mill, a roll mill or an attriter to dilute the dispersion to a desired concentration.

There is no limitation to the film thickness of the resultant positive type photosensitive coating films formed by the positive type photosensitive coating, and the film thickness may be suitably selected depending on the performance desired of the color filter. The dry film thickness may be usually 0.3–20 µm, preferably 0.5–15 µm, more preferably 1–3 µm. The film thickness may be adjusted by controlling, for example, electrodeposition conditions, such as electric current, voltage, electrodeposition time and bath temperature. However, film thickness adjustment may be usually made under the same conditions as those for electrodeposition coating of colored coatings, as will be explained subsequently.

In the step (A) of the present invention, the photosensitive coating film is exposed separately through at least two negative pattern masks in such manner that each pattern mask is different in light irradiation dose. Namely, the exposure is effected in such manner that crosslinking density due to irradiation of light to the photosensitive coating film varies by at least two degrees (at least 3 degrees including non-light irradiated portion). In this case, a portion of the film becomes hardly soluble in a developing liquid as the crosslinking density in the portion becomes higher.

Although there is no special limitation in a method for exposing the film to light through at least 2 different negative pattern masks in such manner that each negative pattern mask is different in light irradiation dose, such a method can be mentioned wherein exposure time is varied, wherein the exposure distance is varied or wherein output of the light source is varied. A usually employed mask having transparent portions and black portions is adequate as the negative pattern mask, and no special mask is necessarily required but at least 2 kinds of mask and an exposure work for the respective masks are necessary.

No special limitation exists in regions to be exposed to light in different doses, so far as portions of at least two degrees exist therein. They can properly be selected according to the sort and number of the colored coatings used. More specifically, for example, a color filter having 3 colored regions and a black light-intercepting portion is produced by using at least 3 negative pattern masks in such manner that each mask is exposed to light every time in a different light irradiation dose to prepare regions of three degrees exposed in different light irradiation doses and a region unexposed to light.

In this case, the difference in light irradiation dose between the regions exposed in different light irradiation doses can properly be selected depending on development conditions as will be described hereinafter. In general, the difference in solubility in a developing solution will desirably become larger as the relative difference between the crosslinking density by light irradiation becomes larger. Accordingly, preferable is a method wherein the light irradiation dose to the region to which the light irradiation dose becomes maximum is increased to enhance the crosslinking density of the photosensitive coating film while the light irradiation dose to the region to which the light irradiation dose becomes minimum is decreased to reduce the crosslinking density of the photosensitive coating film. Thus, a significant difference of 5% or more is desirable, although no limitations are placed on the relative difference in the light irradiation dose.

Light exposure may be usually achieved using a system radiating a large quantity of ultraviolet rays. For example, a high pressure mercury lamp, an ultra high pressure mercury lamp or a metal halide lamp may be used as a light source. If necessary, other radiation rays may also be employed. Light exposure conditions may be selected suitably depending on photosensitive coatings employed, light exposure devices and negative masks.

In the step (A) of the present invention, by effecting light exposure through a negative pattern mask in such manner that the light irradiation dose may be different in at least 2 degrees, a different light exposure state (including unexposed state) can be produced in the photosensitive coating film, which is one grade more than the number of varied light irradiation.

In the step (A') of the present invention, the positive type photosensitive coating film is exposed to light through at least two different positive pattern masks in such manner that each positive pattern mask is different in light irradiation dose. Namely, the light irradiation dose by light irradiation to the positive type photosensitive coating film is different in at least 2 degrees (at least 3 degrees including the portion to which light irradiation is not made). In this case, the larger is the light irradiation dose, solubility in a developing solution becomes greater.

The light exposure in the step (A') is carried out in accordance with the method of light exposure in the step (A).

In the method of the present invention, a colored layer is formed, next to the above step (A), by developing and removing the negative type photosensitive coating film in the pattern region and repeating an operation of applying a color coating by electrodeposition onto the exposed electrically conductive layer to form a colored layer successively for the respective pattern regions in the order smaller in the light irradiation dose [referred to hereinafter as the step (B)]. Or otherwise, the method of the present invention comprises developing and removing the positive type photosensitive coating film in the pattern regions, successive to the above step (A'), and repeating an operation of applying a colored coating by electrodeposition onto the exposed electrically conductive layer to form a colored layer successively for the respective pattern regions in the order larger in the light irradiation dose [referred to hereinafter as the step (B')].

In the step (B), a portion of the negative photosensitive coating film corresponding to a pattern in the smallest light irradiation dose is selectively developed and removed and a colored coating is applied onto the exposed electrically conductive layer by way of electrodeposition. Next, a colored layer can be formed by successively repeating an operation of selectively developing and removing a portion of the negative type photosensitive coating film corresponding to the secondly smallest light irradiation dose of the pattern and applying a colored coating onto the exposed electrically conductive layer by way of electrodeposition.

The conditions for selectively developing and removing the negative type photosensitive coating film may be changed depending on the dose of light exposure in the region to be selectively removed, solubility of the used negative type photosensitive coating in the developing solution, the types and the concentrations of the developing solution, development temperature and time. Thus, the conditions may be suitably selected for the resin used for the preparation of the negative type photosensitive coating. Specifically, for example, aqueous solutions containing dissolved acidic substances may be used as a developing solution when the cationic resin is used as a component of he negative type photosensitive coating. The acidic substances include organic acids, such as formic acid, acetic acid, propionic acid or lactic acid; and inorganic acids, such as hydrochloric acid or phosphoric acid. If lactic acid is used as a developing solution, for example, it may be used at a concentration usually of 0.01 to 50 wt. % and preferably 0.01 to 30 wt. %. The developing temperature is usually 10° to 70° C. and preferably 20° to 50° C. and the developing time is usually 5 to 600 seconds. As a developing solution in case of employing an anionic resin as a component of the negative type photosensitive coating, an aqueous solution containing basic substances dissolved therein may be employed. The basic substances may include sodium carbonate, sodium hydrogen carbonate, sodium metasilicate, tetraalkylammonium hydroxide, sodium hydroxide, potassium hydroxide and the like. If an aqueous solution of sodium carbonate is used as a developing solution, for examples, sodium carbonate may be used at a concentration of 0.01 to 25 wt. % and preferably 0.05 to 15 wt. %. The temperature is usually 10°–70° C. and the development time usually is selected within a range of 5 to 600 and preferably 5 to 300 seconds. For the developing solutions, organic solvents such as alcohols, glycol ethers, ketones, chlorinated hydrocarbons and the like may be employed. Surfactants or defoaming agents may also be added to these developing solutions for improving wettability or anti-foaming properties. Aqueous developing solutions are preferably employed in view of non-toxicity and sanitation in working environments.

In the step (B'), a portion of the positive photosensitive coating film corresponding to a pattern in maximum light irradiation dose is selectively developed and removed and a colored coating is applied onto the exposed electrically conductive layer by way of electrodeposition. Next, a colored layer can be formed by successively repeating an operation of selectively developing and removing a portion of the positive type photosensitive coating film corresponding to the second largest light irradiation dose of the pattern and applying a colored coating onto the exposed electrically conductive layer by way of electrodeposition.

A developing solution which can be employed for developing and removing the positive type photosensitive coating film may, for example, be an aqueous solution in which a basic substance is usually dissolved. The basic substance includes sodium carbonate, sodium hydrogen carbonate, sodium metasilicate, tetraalkylammonium hydroxide, sodium hydroxide, potassium hydroxide and the like. For example, where an aqueous solution of sodium metasilicate is employed as a developing solution, development may be effected at the concentration of sodium metasilicate of usually 0.01 to 25 wt. % and preferably 0.05 to 20 wt. % at a temperature of 10° to 70° C. and preferably 15° to 50° C., and the developing time may preferably be selected from the range of 2–600 seconds and preferably 30–300 seconds.

As the developing solutions used for the step (B'), organic solvents such as alcohols, glycol ethers, ketones, chlorinated hydrocarbons and the like may be employed. Surfactants or defoaming agents may also be added to these developing solutions for improving wettability or anti-foaming properties. Aqueous developing solutions are preferably employed in view of non-toxicity and sanitation in working environments.

After the above development, an operation for applying a colored coating onto the exposed electrically conductive layer by electrodeposition to form a colored layer is carried out. This operation is carried out in both the steps (B) and (B'), using the same manner and material.

for the colored coating, cationic resins or anionic resins are used as a film-forming component, and dyes and/or pigments are added as a colorant component. Acidic or basic substances may also be employed for dissolving and/or dispersing the coating in water. Organic solvents may further be to the colored coating added for facilitating dissolution and/or dispersion of the resins and for improving bath stability or for producing smooth coating films.

The cationic resins may, for example, be resins composed of acrylic resins, epoxy resins, urethane resins, polybutadiene resins, polyamide resins and the like into which amino groups or onium groups such as ammonium or sulfonium groups have been introduced and which have been solubilized or dispersed in water with an acid such as formic acid, acetic acid, propionic acid, lactic acid or the like or an acidic substance.

The anionic resins may, for example, be resins composed of acrylic resins, polyester resins, maleinated oil cesins, polybutadiene resins, epoxy resins and the like into which carboxyl groups, etc. have been introduced and which have been solubilized or dispersed in water with a basic substance such as triethylamine, diethylamine, dimethylethanolamine, ammonia or the like. Furthermore, the film-forming component in the colored coating may have photosensitivity, and prepolymers or resins suited for electrodeposition among those used for the negative type photosensitive coating film in the above step (A) can be used therefor. A photopolymerization initiator may be used jointly.

The colored coatings employed in step (B) or (B') may desirably be different in type, color hue, color concentration or color brightness in the regions exhibiting different light irradiation doses, but the same colored coatings may be used in common for these regions.

The color hue of the colored coating may be selected depending on the objects. In case the photosensitive coating used in the step (A) or (A') has a color hue, for example, a different color hue may be used for the above photosensitive coating, the colored coating used in the step (B) or (B'), and each of the colored coatings used in several times of electrodeposition being carried out in the step (B) or (B').

The dyes and/or pigments used for the above colored coatings are selected according to the color hue aimed at and are desirably selected from those which are free of problem in transparency of the resultant coating film, stability of the coating, electrodeposition characteristics, durability of the coating film, etc. In this respect, oil-soluble dyes or dispersion dyes, specifically, for example, those of azo, anthraquinone, benzodifuranone and condensed methine series are mentioned as the dyes. As the pigments are mentioned, for example, organic pigments such as those of azo lake, quinacridone, phthalocyanine, isoindolinone, anthraquinone, and thioindigo; and inorganic pigments such as chrome yellow, iron oxide, chrome vermilion, chrome green, ultramarine, prussian blue, cobalt blue, cobalt green, emerald green, titanium white and carbon black. Two or more of the dyes and/or pigments may be used as a mixture unless they damage their characteristics.

In the preparation of the colored coatings, resins, dyes and/or pigments, acidic or basic substances, and, if necessary, organic solvents, dispersing assistants for the dyes or pigments, leveling agents for improving smoothness of the coating films, viscosity controlling agents or anti-foaming agents are mixed together and dispersed sufficiently by the aid of a conventional dispersion device such as sand mill, roll mill or attriter. The resulting dispersion is then diluted in water to a predetermined concentration of about 4 to 25 wt. % and preferably to 7 to 20 wt. % of solid content to produce a coating suitable for electrodeposition. The so-produced colored coating may be applied onto the electrically conductive layer by electrodeposition for providing a colored layer. There is no particular limitation to the film thickness of the colored layer, which may be suitably selected depending on the performance required of a color filter. However, the dry thickness is usually 0.3 to 5 μm and preferably 1 to 3 μm.

Although the conditions of electrodeposition may be suitably selected depending on the types of the colored coatings and film thickness of the colored coating layers aimed at, the electrical voltage is usually 5 to 500 V dc and preferably 10 to 300 V dc, the electrodeposition time is usually 5 to 300 sec and preferably 10 to 200 sec and the liquid temperature is usually 10° to 35° C. and preferably 15° to 30° C. After lapse of the electrodeposition time sufficient to produce a desired film thickness, current conduction is discontinued and the substrate is taken out of the bath. The substrate is then freed of excess bath liquid by washing with water and dried to produce the colored layer.

Although the drying conditions may be selected suitably depending on the conditions of the subsequent process steps, it is usually preferred that the conditions be such that surface moisture is dried, for example, the drying time be of the order of 1 to 20 minutes and preferably 2 to 10 minutes at a temperature of, for example, 120° C. or lower and preferably 30°–100° C. If the drying temperature is higher than 120° C., the photosensitive coating film may occasionally be cured under heat to raise difficulties in the subsequent development process.

Although the desired color filter may be produced by the above described steps (A) or (A') and (B) or (B'), heating, curing or photocuring may be effected, if needed, for further improving weather-resisting property or chemicals-resisting property. If the heating or curing is effected, the temperature is usually 100° to 250° C. and preferably 180° to 250° C. and the processing time is usually 5 minutes to one hour and preferably 15 to 40 minutes.

The steps of the present invention will now be illustrated by way of FIGS. 1 and 2, but the present invention is not limited thereby.

Figure 2A:
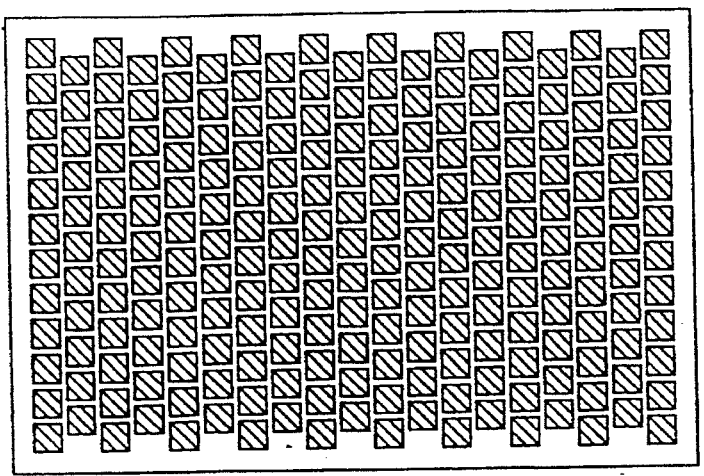
FIG. 2A is an enlarged schematic view showing a pattern mask used in Examples of the present invention.
Figure 2B:
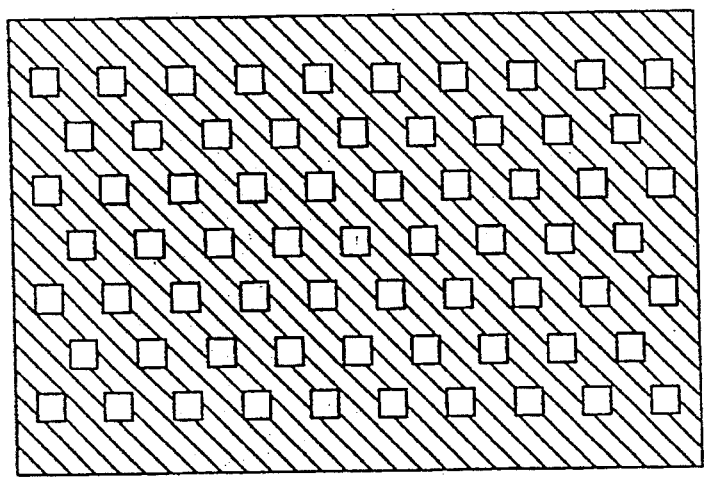
FIG. 2B is an enlarged schematic view showing another pattern mask used in Examples of the present invention.
Figure 2C:
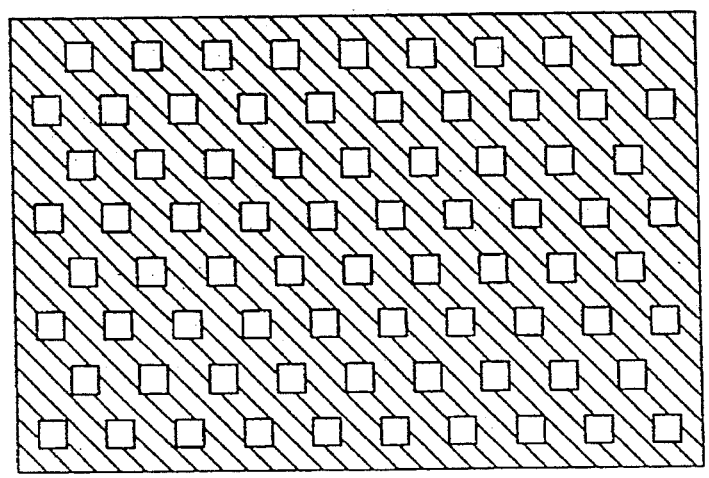
FIG. 2C is an enlarged schematic view showing a still another pattern mask used in the present invention.
Figure 3:
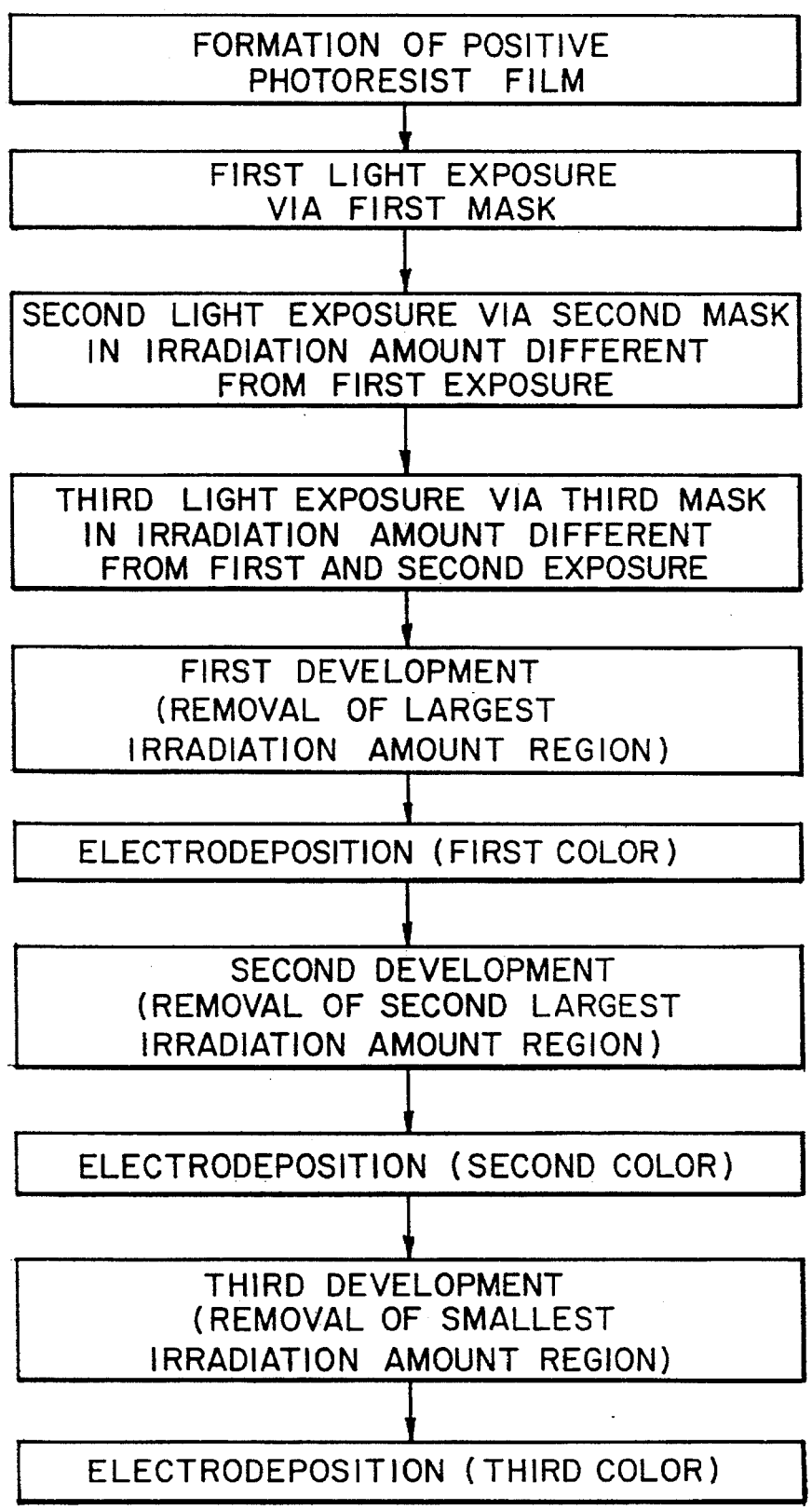
FIG. 3 is a flow chart showing another embodiment of the present invention different from that shown in FIG. 1.

FIG. 1 is a flow chart showing an embodiment of the present invention. FIGS. 2A–C are enlarged schematic views showing 3 pattern masks having different patterns used for varying the light irradiation dose to the photosensitive coating film in 4 degrees (including unexposed portion) among the embodiment of the present invention. FIG. 3 is a flow chart showing another embodiment of the present invention which is a process different from that shown in FIG. 1.

The first method of the present invention will now be described hereunder.

A substrate which has been prepared by forming a black negative type photosensitive coating film (to become a light-intercepting film) on a transparent substrate having a transparent electrically conductive layer on the surface thereof and drying the film is irradiated through a pattern mask as shown, for example, in FIG. 2A with a light of, for example, 400 mJ/cm$^2$ as a first exposure. Next, the substrate is irradiated through a pattern mask as shown in FIG. 2B with a light of, for example, 50 mJ/cm$^2$ as a second exposure. Further, the substrate is irradiated through a pattern mask as shown in FIG. 2C with a light of, for example, 100 mJ/cm$^2$ as a third exposure. A first development is then carried out to expose a portion of the electrically conductive layer where the light irradiation has not been made, and subsequently coating of a colored coating of a first color by way of electrodeposition is carried out in an electrodeposition bath containing the colored coating and the substrate was washed with water.

Next, a second development (under conditions different from those in the first development) is carried out to expose a portion of the electrically conductive layer where light exposure has been made through the pattern mask as shown in FIG. 2B, and subsequently coating of a colored coating of a second color by way of electrodeposition is carried out in an electrodeposition bath containing the colored coating and the substrate is washed with water.

further, a third development (under conditions different from those in the first and second developing operations) is carried out to expose a portion of the electrically conductive layer where light exposure has been made through the pattern mask as shown in FIG. 2C, and subsequently coating of a colored coating of a third color by way of electrodeposition was carried out in an electrodeposition bath containing the colored coating and the substrate was washed with water and dried to form colored layers having the light-intercepting film, whereby the color filter of the present invention can be obtained.

Next, the second method of the present invention will now be described hereunder.

A substrate which has been prepared by forming a positive type photosensitive coating film on a transparent substrate having a transparent electrically conductive layer on the surface thereof and drying the film is irradiated through a pattern mask shown, for example, in FIG. 2A with a light of, for example 400 mJ/cm$^2$ as a first exposure. Next, the substrate is irradiated through a pattern mask as shown in FIG. 2B with a light of, for example, 50 mJ/cm$^2$ as a second exposure. Further, the substrate is irradiated through pattern mak as shown in FIG. 2C with a light of, for example, 100 mJ/cm$^2$ as a third exposure. A first development is then carried out to expose a portion of the electrically conductive layer where irradiation of the light of 400 mJ/cm$^2$ has been made, and subsequently coating of a colored coating of a first color (for example, a black-hued colored coating) is carried out by way of electrodeposition in an electrodeposition bath containing the colored coating and the substrate was then washed with water.

Next, a second development (under conditions different from those in the first development) is carried out to expose a portion of the electrically conductive layer where the light irradiation through the pattern mask as shown in FIG. 2C has been made, and subsequently coating of a colored coating of a second color (for example, a red-hued color) is carried out by way of electrodeposition in an electrodeposition bath containing the colored coating and the substrate is then washed with water.

Further, a third development (under conditions different from those in the first and second developing operations) is carried out to expose a portion of the electrically conductive layer where the light irradiation through the pattern mask as shown in FIG. 2B has been made, and subsequently coating of a colored coating of a third color (for example, a green color) is carried out by way of electrodeposition in an electrodeposition bath containing the colored coating and the substrate is washed with water.

Furthermore, a fourth development (under conditions different from those of the first, second and third developing operations) was carried out to remove any remaining portion of the positive type photosensitive coating film thereby exposing the electrically conductive layer, and subsequently coating of a colored coating of a fourth color (for example, blue color) is carried out by way of electrodeposition in an electrodeposition bath containing the colored coating and the substrate is washed with water and dried to form colored layers having the light-intercepting film whereby a color filter of the present invention is obtained.

The method of the present invention for producing color or filters can increase the degree of freedom in the patterned shape of the colored layers without necessity of any highly advanced fine processing techniques while increased color filter size can be coped with. Accordingly, the present invention is industrially of extreme advantage as the method makes it possible to produce color filters in a large quantity.

EXAMPLES Of THE INVENTION

The present invention will be hereinafter explained in detail with reference to Synthesis Examples and Examples, but it is to be construed that the present invention is not limited by these.

Synthesis Example 1

Synthesis of Negative Type Photosensitive Resin (A-1)

Synthesis of Amine-added Expoxidated Polybutadiene (a-1)

1,000 g of epoxidated liquid polybutadiene (manufactured by NIPPON PETROCHEMICALS CO., LTD. under the trade name of "E-1000-8™", with a number average molecular weight of 1,000 and an oxirane oxygen content of 8%) were charged into a 2-liter separable flask, fitted with a thermometer, a stirrer and a reflux cooling pipe. After replacing the atmosphere within the system by nitrogen, 231.2 g of methylethanolamine were added and reaction was carried out at 170° C. for five hours. Non-reacted methyl ethanolamine was then distilled off under reduced pressure to produce amine-added epoxidated polybutadiene (a-1) with an amine value of 230.4 mmol /100 g.

Synthesis of Unsaturated Group-Containing Isocyanate Compound 435.5 g of 2,4-tolylene diisocyanate and 266.1 g of diethyleneglycol dimethyl ether were charged into a 2-liter round-bottom flask, which may be heated and cooled and which had been fitted with a thermometer, a stirrer, a reflux cooling pipe and a dropping funnel. After heating to 40° C., 362.8 g of 2-hydroxyethyl acrylate were added dropwise from the dropping funnel. 200 ppm of p-benzoquinone was also added at this time. Since some heat was evolved due to the dropwise addition of 2-hydroxyethyl acrylate, the system was cooled, if necessary, for maintaining the constant temperature. After the end of the dropwise addition of 2-hydroxyethyl acrylate, the temperature was raised to 70° C., at which temperature the reaction was carried out for three hours. An IR-absorption spectrometry revealed that the absorption intensity of the isocyanate groups was decreased to about one half that before start of the reaction. The reaction system was then cooled to produce an unsaturated group-containing isocyanate compound (a-2).

Synthesis of Negative Type Photosensitive Resin (A-1)

500 g of (a-1) were dissolved in 166.7 g of diethyleneglycol dimethyl ether in a 2-liter separable flask. 713.4 g of (a-2) (in which isocyanate groups are obtained in an among of 0.8 equivalent to 1 equivalent of hydroxyl groups) were added dropwise at 40° C., at which temperature the reaction was carried out for one hour. The IR-absorption spectral analyses indicated that the isocyanate groups had disappeared. A photosensitive resin A-1), in which (a-2) was added to (a-1), was produced.

Synthesis Example 2

Synthesis of Polyamine (A-2) Solution 1,000 g of "NISSEKI POLYBUTADIENE B-1000™" (trade name of a product manufactured by NIPPON PETROCHEMICALS CO., LTD., with a number average molecular weight of 1,000, an iodine value of 430, and 1,2-linkage of 65 percent), 554 g of maleic anhydride, 10 g of xylene and 3.0 g of trimethylhydroquinone were charged into 3-liter separable flask fitted with a thermometer, a stirrer, a reflux cooling pipe and a nitrogen blowing tube, and reaction was carried out under nitrogen at 190° C. for five hours. After non-reacted maleic anhydride and xylene were distilled off, maleinated polybutadiene with a total acid value of 400 mg KOH/g, was produced.

Then, 1,000 g of the maleinated polybutadiene and 433 g of ethyleneglycol monobutyl ether were charged and uniformly dissolved in a 3-liter separable flask fitted with a reflux cooling pipe. 364.3 g of N,N-dimethylaminopropylamine were added dropwise over one hour, while the temperature of 135° C. was maintained under a nitrogen stream. After the same temperature was maintained for five hours, a polyamine solution containing tertiary amino groups and imido groups (A-2 solution ) was produced. The produced polyamine (A-2 solution) contained 206 mmols of tertiary amines per 100 g of solution, with the non-volatile content amounting to 75.0 wt. %.

Synthesis Example 3

Synthesis of Hemi-Esterified Product (A-3) solution 1,000 g of "NISSEKI POLYBUTADIENE B-1000™" (trade name of a product manufactured by NIPPON PETROCHEMICALS CO. LTD., with a number average molecular weight of 1,000, an iodine value of 430, and 1,2-linkage of 65 percent) 554 g of maleic anhydride, 10 g of xylene and 3.0 g of trimethylhydroquinone were charged into 3-liter separable flask fitted with a thermometer, a stirrer, a reflux cooling pipe and a nitrogen blowing tube, and reaction was carried out under nitrogen at 190° C. for five hours. After non-reacted maleic anhydride and xylene were distilled off, maleinated polybutadiene with a total acid value of 400 KOH/g was produced.

Then, 1,000 g of the maleinated polybutadiene and 461.8 g of diethyleneglycol dimethyl ether, 3.0 g of N,N-dimethylbenzylamine and 385.5 g of benzyl alcohol were charged into a 3-liter flask fitted with a reflux cooling tube. After the mixture was dissolved uniformly, reaction was carried out under nitrogen at 120° C. for two hours to produce a hemi-esterified product (A-3) in solution. The total acid value of the produced hemi-esterified product (A-3) in solution was 109.3 mg KOH/g and the non-volatile content amounted to 75.0 wt. %.

Synthesis Example 4

Synthesis of Resin (A-4)

100 g of the maleinated polybutadiene obtained in Synthesis Example 3, 188.5 g of diethyleneglycol dimethyl ether and 0.4 g of hydroquinone were charged into a 2-liter separable flask fitted with a reflux cooling tube. After the temperature was raised to 80° C., the mixture was agitated and homogenized. Then, 165.6 g of 2-hydroxyethyl acrylate and 20 g of triethylamine were added and reaction was carried out at the above temperature for two hours to produce a solution of a hemi-esterified product of the maleinated polybutadiene (A-4). The total acid value of the produced hemi-esterified product (A-4) solution was 105 mg KOH/g and the non-volatile content amounted to 75.0 wt. %.

Synthesis Example 5

Preparation of Black Negative Type Photosensitive Coating (B-1)

To 500 g of the photosensitive coating (A-1) obtained in synthesis Example 1 were added under agitation 27.0 g of "IRGACURE 907™" (a trade name, manufactured by CIBA-GEIGY) and 3/0 g of "KAYACURE DETX™" (a trade name, manufactured by NIPPON KAYAKU CO., LTD.) as photopolymerization initiators and CARBON BLACK #5B™ (a product of MITSUBISHI KASEI KOGYO CO., LTD.), and the whole was mixed together. Using a three-roll mill for laboratory use (KODAIRA MFG. CO.), the mixture was dispersed until the diameter of carbon black particles became 0.3 µm or less. The measurement of the particle size was made by using a COULTER COUNTER N4™ (manufactured by COULTER INC.).

To the dispersion mixture were added 18.7 g of acetic acid as a neutralizing agent, and the mixture was vigorously stirred to homogenize the mixture again. Deionized water was then slowly added, and the whole was vigorously stirred by the aid of a high-speed mixer to disperse the solid in water to prepare a (cationic electrodeposition type) aqueous solution of a black negative type photosensitive coating (B-1) having a solid concentration of 15% by weight while vigorously mixing the whole.

Synthesis Example 8

Preparation Black Negative Type Photosensitive Coating (B-2)

To 500 g of a solution of the hemi-ester (A-4) obtained in Synthesis Example 4 were added 27.0 g of "IRGACURE 907™" (a tradename, manufactured by CIBA-GEIGY) and 3.0 g of "KAYACURE DETX™" (a trade name, manufactured by NIPPON KAYAKU CO., LTD.) as photopolymerization initiators and 37.5 g of CARBON BLACK #5B™ (a product of MITSUBISHI KASEI KOGYO CO., LTD.) under agitation and the whole was mixed together. Using a three-roll mill for laboratory, use (KODAIRA MFG. CO.), the mixture was dispersed until the diameter of carbon black particles became 0.3 µm or less. The measurement of the particle size was carried out by using a COULTER COUNTER N4™ (manufactured by COULTER INC.).

To the dispersion mixture were added 33.7 g of triethylamine as a neutralizing agent, and the mixture was vigorously stirred to homogenize the mixture again. Deionized water was then slowly added, and the whole was vigorously stirred by the aid of a high-speed mixer to disperse the solid in water to prepare an (anionic electrodeposition type) aqueous solution of a black negative type photosensitive coating (B-2) having a solid concentration of 1.5% by weight while vigorously mixing the whole.

Synthesis Example 7

Preparation of Black Negative Photosensitive Coating (B-3)

To 500 g of a solution of the negative type photosensitive resin (A-1) obtained in Synthesis Example 1 were added 27.0 g of "IRGACURE 907"™) (a trade name, manufactured by CIBA-GEIGY) and 3.0 g of "KAYACURE DETX™" (a trade name, manufactured by NIPPON KAYAKU CO., LTD.) as photopolymerization initiators and 37.5 g of CARBON BLACK #5B™ (a product of MITSUBISHI KASEI KOGYO CO., LTD.) under agitation and the whole was mixed together. Using a three-roll mill for laboratory use (KODAIRA MFG. CO.), the mixture was dispersed until the diameter of carbon black particles became 0.3 µm or less. The measurement of the particle size was carried out by using a COULTER COUNTER N4™ manufactured by COULTER INC.).

The above dispersion mixture was diluted with methyl ethyl ketone so that the concentration of the solid matter became 40% by weight to prepare a solution (B-3) of a black negative type photosensitive coating.

Synthesis Example 8

Preparation of Colored coatings (C-1, C-2 and C-3)

A solution of the hemi-ester (A-3) and pigments were mixed under agitation and dispersed by a three-roll mill for laboratory use (manufactured by KODAIRA MFG. CO.) to have a particle size of not more than 0.3 µm. The particle size was measured using a COULTER COUNTER N4™ (manufactured by a COULTER INC.). To each of the resulting dispersion mixtures was added triethylamine as a neutralizer and each of the mixtures was re-homogenized. While deionized water was added gradually, each homogenized mixture was agitated vigorously so that the resulting mixture was dispersed in water to produce colored coatings (C-1), (C-2) and (C-3) having a solid concentration of 10 wt %. Table 1 shows the (anionic electrodeposition type) compositions of the produced aqueous solutions of three colored coatings. (In Table 1, the figures denote parts by weight).

TABLE 1

| Coating No. | C-1 | C-2 | C-3 |
|---|---|---|---|
| Color | Red | Yellow | Blue |
| Hemi-ester (A-3) solution | 213.3 | 213.3 | 213.3 |
| Triethylamine (neutralizer) | 21.0 | 21.0 | 21.0 |
| Deionized water | 1725.7 | 1725.7 | 1725.7 |

TABLE 1-continued

| Coating No. | C-1 | C-2 | C-3 |
|---|---|---|---|
| Phthalocyanine blue (Note 1) | — | — | 20 |
| Phthalocyanine green (Note 2) | — | 20 | — |
| Azo metal salt red pigment (Note 3) | 20 | — | — |

(Note 1)"SR-150C" ™ (manufactured by SANYO SHIKISO KK)
(Note 2)"SAX" ™ (manufactured by SANYO SHIKISO KK)
(Note 3)"PIGMENT RED 4BS" ™ (manufactured by SANYO SHIKISO KK)

Synthesis Example 9

Preparation of Colored Coatings (C-4, C-5 and C-6)

The polyamine (A-2) solution and pigments were mixed under agitation and dispersed by a three-roll mill for laboratory use (manufactured by KODAIRA MFG. CO.) to have a particle size of not more than 0.3 μm. The particle size was measured using a COULTER COUNTER N4™ (manufactured by COULTER INC.). To each of the resulting dispersion mixtures was added acetic acid as a neutralizer and each of the resulting mixture was agitated thoroughly. After re-homogenization, deionized water was added slowly to each re-homogenized mixture. Each of the mixtures was agitated vigorously by the aid of a high-speed mixer to effect dispersion in water to prepare colored coatings (C-4), (C-5) and (C-6) having solid concentrations of 10 wt %. Table 2 shows the compositions of the aqueous solutions of the (cationic electrodeposition type) produced three colored coatings. (In Table 2, the figures denote parts by weight.)

TABLE 2

| Coating No. | C-4 | C-5 | C-6 |
|---|---|---|---|
| Color | Red | Green | Blue |
| Polyamine (A-2) solution | 213.3 | 213.3 | 213.3 |
| Acetic acid (neutralizer) | 19.8 | 19.8 | 19.8 |
| Deionized water | 1726.9 | 1726.9 | 1726.9 |
| Phthalocyanine blue (Note 1) | — | — | 20 |
| Phthalocyanine green (Note 2) | — | 20 | — |
| Azo metal salt red pigment (Note 3) | 20 | — | — |

(Note 1)"SR-150C" ™ (manufactured by SANYO SHIKISO KK)
(Note 2)"SAX" ™ (manufactured by SANYO SHIKISO KK)
(Note 3)"PIGMENT RED 4BS" ™ (manufactured by SANYO SHIKISO KK)

Synthesis Example 10

Preparation of Colored Coating (C-7)

To 300 g of a solution of the hemi-ester (A-3) were added 29.5 g of triethylamine for neutralization, and 870.5 g of deionized water were added to prepare an aqueous solution having a solid concentration of 25% by weight. To the resultant aqueous solution were added 30 g of carbon black ("CARBON BLACK #950™", a trade name, manufactured by MITSUBISHI KASEI KK) and 1000 g of alumina beads having an average particle diameter of 0.5 mm, and the mixture was stirred vigorously for 3 hours using a sand grinder (manufactured by IGARASHI KIKAI), Deionized water was then added to prepare a black anionic type electrodeposition coating having a solid concentration of 15% by weight.

Synthesis Example 11

Black Coating (C-8) and Colored Coatings (C-9), (C-10) and (C-11)

An acrylic resin (a trade name "ARON S-4030™" manufactured by TOA GOSEI KAGAKU KK) was neutralized with triethylamine until the pH value became about 8, and deionized water was added to make an aqueous solution of the resin (S).

Carbon black, an azo metal salt red pigment, phthalocyanine green, and phthalocyanine blue were added under agitation to the aqueous solution of the resin (S), respectively to give pigment dispersions of black-hue, red-hue, green-hue and blue-hue. Separately, a mixture of a melamine resin (a trade name "SUMIMAL M-56™" manufactured by SUMITOMO CHEMICAL CO., LTD.) with the aforementioned acrylic resin was neutralized with triethylamine to have pH 8, to which deionized water was then added to prepare an aqueous solution of the resin (T).

By adding the aqueous solution of the resin solution (T) to each of the colored pigment dispersions, a black-hued coating (C-8) and colored coatings (C-9, C-10, and C-11) as shown in Table 3 below were obtained, which were of thermosetting type and of anionic electrodeposition type.

TABLE 3

| Coating No. | C-8 | C-9 | C-10 | C-11 |
|---|---|---|---|---|
| Color | Black | Red | Green | Blue |
| Acrylic resin (*1) | 750.0 | 750.0 | 750.0 | 750.0 |
| Melamine resin (*2) | 250.0 | 250.0 | 250.0 | 250.0 |
| Triethylamine (Netralizer) | 61.8 | 61.8 | 61.8 | 61.8 |
| Carbon black | 333.0 | — | — | — |
| Phthalocyanine Blue (*3) | — | — | — | 300.0 |
| Phthalocyanine Green (*4) | — | — | 300.0 | — |
| Azo Metal Salt Red Pigment (*5) | — | 300.0 | — | — |
| Deionized Water | 11700.0 | 11700.0 | 11700.0 | 11700.0 |

(*1)"ARON S-4030" ™ (mfd. by TOAGOSE CHEMICAL INDUSTRY CO., LTD.)
(*2)"SUMIMAL M-56" ™ (mfd. by SUMITOMO CHEMICAL CO., LTD.)
(*3)"SR-150C" ™ (mfd. by SANYO SHIKISO KK)
(*4)"SAX" ™ (mfd. by SANYO SHIKISO KK)
(*5)"PIGMENT RED 4BS" ™ (mfd. by SANYO SHIKISO KK)

EXAMPLE 1

Using a pyrex glass substrate, 1.1 mm in thickness, having an ITO (indium-tin oxide) film, 80 nm in thickness, on its surface, as a cathode, and using a stainless steel beaker containing an aqueous solution of a black negative type photosensitive coating (B-1), as an anode, electrodeposition was carried out for 3 minutes at 25° C. at a dc voltage of 30 V. After washing the glass substrate with ion-exchanged water followed by drying at 20° C. for 5 minutes and cooling, a non-tacky black uniform coating film of 2 μm in thickness was formed. Among pattern masks shown in FIGS. 2A–C, a mask as shown in FIG. 2A was intimately contacted with the coating film and irradiated with UV rays of 400 mJ/cm$^2$, using a UV exposure device having a high pressure mercury lamp (manufactured by ORC MANUFACTURING CO., LTD. under the trade name of "JL-3300™"). Next, a mask as shown in FIG. 2B was intimately contacted with the coating film and irradiated with UV rays of 50 mj/cm$^2$. A mask as shown in FIG. 2C was then intimately contacted with the coating film and irradiated with UV rays of 100 mJ/cm$^2$.

On development with a 0.05 wt. % aqueous solution of lactic acid, unexposed portions of the black photosensitive coating were selectively removed to expose the ITO film. After washing with water and drying, electrodeposition was carried out by applying a d.c. voltage of 25 V at 25° C. for 3 minutes using the glass substrate as an anode and a stainless steel beaker containing a colored coating (C-1) as a cathode. After washing the glass substrate with ion-exchanged water, followed by drying at 80° C. for 5 minutes, a red-hued colored layer, 2 μm in thickness, which was not tacky at ordinary temperature, was produced. After development with a 0.5 wt. % aqueous solution of lactic acid, no change was noticed in portions corresponding to the red-hued colored layer and a light-intercepting layer, while the portion of the black photosensitive coating corresponding to the smallest light irradiation dose (50 mJ/cm$^2$) was selectively removed.

After washing with water and drying, electrodeposition was carried out for 3 minutes under the condition of d.c. voltage of 25 V at 25° C., using the glass substrate as an anode and a stainless steel beaker containing the colored coating (C-2) as a cathode. On washing the glass substrate with ion-exchanged water, no change was noticed in the portions corresponding to the previously formed red-hued colored layer and the light-intercepting layer, while forming a green-hued colored layer. Drying at 80° C. for 5 minutes followed by development with a 3.0 wt. % aqueous solution of lactic acid, no change was noticed at all in the red-hued and green-hued colored layers and in the portions of light-intercepting film as well, while portions of the black negative type photosensitive coating corresponding to the second smallest light irradiation dose (100 mJ/cm$^2$) were selectively removed.

After washing with water and drying, electrodeposition was carried out for 3 minutes under the condition of d.c. voltage of 25 V at 25° C., using the glass substrate as an anode and a stainless steel beaker containing the colored coating (C-3) as a cathode. On washing the glass substrate with ion-exchanged water, no change was detected in the previously formed red-hued and green-hued colored layers and in the light-intercepting layer, while forming a blue-hued colored layer. After drying at 80° C. for 5 minutes, the substrate was heated at 175° C. for 30 minutes for completely curing it whereby each colored filter and the light-intercepting layer after curing were respectively 1.9 μm in thickness and a color filter excellent in transparency and having uniform colored layers was obtained.

EXAMPLE 2

Using as an anode the same glass substrate as in Example 1 and using a stainless steel beaker containing a black negative type photosensitive coating (B-2) as a cathode, electrodeposition was carried out for 3 minutes under the condition of d.c. voltage of 25 V at 25° C. After washing the glass substrate with ion-exchanged water followed by drying it for 5 minutes at 80° C., a non-tacky black uniform coating film of 1.8 μm in thickness was formed.

Among pattern masks shown in FIG. 2A–C, a mask as shown in FIG. 2A was at the outset intimately contacted with the coating film and irradiated with UV rays of 800 mJ/cm$^2$, employing the same UV exposure device as used in Example 1. Next, a mask as shown in FIG. 2B was closely contacted with the coating film and irradiated with UV rays of 100 mJ/cm$^2$. Further, a mask as shown in FIG. 2C was closely contacted with the coating film and irradiated with UV rays of 300 mJ/cm$^2$. On development with a 0.1 wt. % aqueous solution of sodium carbonate, unexposed portions of the black negative type photosensitive coating were selectively removed to expose the ITO film.

After washing with water and drying, electrodeposition was carried out for 3 minutes under the condition of d.c. voltage of 30 V at 25° C., using the glass substrate as a cathode and a stainless steel beaker containing the colored coating (C-4) as an anode. After washing the glass substrate with ion-exchanged water and drying it at 80° C. for 5 minutes, a red-hued colored layer was formed. On development with a 0.75 wt. % aqueous solution of sodium carbonate, no change was noticed in the red-hued colored layer while a portion of the black negative type photosensitive coating corresponding to the smallest light irradiation dose (100 mJ/cm$^2$) was selectively removed.

After washing with water and drying, electrodeposition was carried out for 3 minutes under the condition of d.c. voltage of 30 V at 25° C., using the glass substrate as a cathode and a stainless steel beaker containing the colored coating (C-5) as an anode. On washing the glass substrate with ion-exchanged water, no change was noticed at all in the previously formed red-hued colored layer, while forming a green-hued colored layer. After drying at 80° C. for 5 minutes and development with a 5 wt. % aqueous solution of sodium metasilicate, no change was detected in the red-hued and green-hued colored layers and in portions to become the light-intercepting film as well while portions of the black negative type photosensitive coating corresponding to the second smallest light irradiation dose (300 mJ/cm$^2$) were selectively removed.

After washing with water and drying, electrodeposition was carried out for 3 minutes under the condition of d.c. voltage of 30 V at 25° C. using the glass substrate as a cathode and a stainless steel beaker containing the colored coating (C-6) as an anode. On washing the glass substrate with ion-exchanged water, no change was detected at all in the previously formed red-hued and green-hued colored layers and in the light-intercepting layer, while a blue-hued colored layer was formed. After drying at 80° C. for 5 minutes, the substrate was heated at 70° C. for 30 minutes for completely curing it whereby each colored filter and the light-intercepting layer after curing were respectively 1.8 μm in thickness and a color filter excellent in transparency and having uniform colored layers was obtained.

EXAMPLE 3

A solution of a black negative type photosensitive coating (B-3) was spray-coated onto the same glass substrate as used in Example 1, air dried and then dried at 80° C. for 5 minutes whereby a non-tacky black uniform coating film of 1.5 μm in thickness was formed.

Among pattern masks shown in FIG. 2A–C, a mask as shown in FIG. 2A was at the outset intimately contacted with the coating film and irradiated with UV rays of 500 mJ/cm$^2$, employing the same UV exposure device as used in Example 1. Next, a mask as shown in FIG. 2B was closely contacted with the coating film and irradiated with UV rays of 200 mJ/cm$^2$. Further, a mask as shown in FIG. 2C was closely contacted with the coating film and irradiated with UV rays of 50 mJ/cm$^2$. On development with a 0.05 wt. % aqueous solution of lactic acid, unexposed portions of the black negative type photosensitive coating were selectively removed to expose the ITO film.

After washing with water and drying, electrodeposition was carried out for 3 minutes under the condition of d.c. voltage of 25 V at 25° C., using the glass substrate as an anode and a stainless steel beaker containing the colored coating (C-1) as a cathode. After washing the glass substrate with ion-exchanged water and drying it at 80° C. for 5 minutes, a red-hued colored layer was formed. On development with a 0.5 wt. % aqueous solution of lactic acid, no change was noticed in the red-hued colored layer while a portion of the black negative type photosensitive coating corresponding to the smallest light irradiation dose (50 mJ/cm$^2$) was selectively removed.

After washing with water and drying, electrodeposition was carried out for 3 minutes under the condition of d.c. voltage of 25 V at 25° C., using the glass substrate as an anode and a stainless steel beaker containing the colored coating (C-2) as a cathode. On washing the glass substrate with ion-exchanged water, no change was noticed at all in the previously formed red-hued colored layer, while forming a green-hued colored layer. After drying at 80° C. for 5 minutes and development with a 3 wt. % aqueous solution of lactic acid, no change was detected in the red-hued and green-hued colored layers and in portions to become the light-intercepting film as well while portions of the black negative type photosensitive coating corresponding to the second smallest light irradiation dose (200 mJ/cm$^2$) were selectively removed.

After washing with water and drying, electrodeposition was carried out for 3 minutes under the condition of d.c. voltage of 25 V at 25° C. using the glass substrate as an anode and a stainless steel beaker containing the colored coating (C-3) as a cathode. On washing the glass substrate with ion-exchanged water, no change was detected at all in the previously formed red-hued and green-hued colored layers and in the light-intercepting layer, while a blue-hued colored layer was formed. After drying at 80° C. for 5 minutes, the substrate was heated at 175° C. for 30 minutes for completely curing it whereby each colored filter and the light-intercepting layer after curing were respectively 1.5 μm in thickness and a color filter excellent in transparency and having uniform colored layers was obtained.

EXAMPLE 4

The negative type photosensitive coating resin (A-1) as prepared in Synthesis Example 1 was diluted with methyl ethyl ketone and spray-coated onto a Pyrex glass substrate of 1.1 mm in thickness having an ITO film having a thickness of 80 nm on the surface thereof so that the thickness of the dried coating film might become 15 μm, and then dried at 80° C. for 5 minutes.

Among pattern masks shown in FIG. 2A–C, a mask as shown in FIG. 2A was at the outset intimately contacted with the coating film and irradiated with UV rays of 400 mJ/cm$^2$, employing the same UV exposure device as used in Example 1. Next, a mask as shown in FIG. 2B was closely contacted with the coating film and irradiated with UV rays of 150 mJ/cm$^2$. Further, a mask as shown in FIG. 2C was closely contacted with the coating film and irradiated with UV rays of 75 mJ/cm$^2$. On development with a 0.25 wt. % aqueous solution of lactic acid, unexposed portions of the black negative type photosensitive coating were selectively removed to expose the ITO film.

After washing with water and drying, electrodeposition was carried out for 3 minutes under the condition of d.c. voltage of 25 V at 28° C., using the glass substrate as an anode and a stainless steel beaker containing the colored coating (C-1) as a cathode. After washing the glass substrate with deionized water and drying it at 80° C. for 5 minutes, a red-hued colored pattern which showed no tackiness at room temperature and had a film thickness of 2.5 μm was formed selectively on the portions where the ITO film was exposed.

On development with a 0.5 wt. % aqueous solution of lactic acid, no change was noticed in the red-hued colored layer while a portion of the coating film corresponding to the smallest light irradiation dose (75 mJ/cm$^2$) was selectively removed to expose the ITO film.

After washing with water and drying, electrodeposition was carried out for 3 minutes under the condition of d.c. voltage of 25 V at 28° C., using the glass substrate as an anode and a stainless steel beaker containing the colored coating (C-2) as a cathode. On washing the glass substrate with deionized water and drying the substrate at 80° C. for 5 minutes, no change was noticed at all in the previously formed red-hued colored layer, while forming selectively a green-hued colored pattern which showed no tackiness at room temperature and had a film thickness of 2.5 μm on the portions where the ITO film was exposed. After development with a 2.5 wt. % aqueous solution of lactic acid, no change was detected in the previously formed red-hued and green-hued colored layers while portions of the coating film corresponding to the second smallest light irradiation dose (150 mJ/cm$^2$) were selectively removed to expose the ITO film.

After washing with water and drying, electrodeposition was carried out for 3 minutes under the condition of d.c. voltage of 25 V at 28° C. using the glass substrate as an anode and a stainless steel beaker containing the colored coating (C-3) as a cathode. After washing the glass substrate with ion-exchanged water and drying the substrate at 80° C. for 5 minutes, it was found that no change was noticed at all in the previously formed red-hued and green-hued colored portions while a blue-hued pattern which showed no tackiness at room temperature and had a film thickness of 2.5 μm was formed in portions where the ITO film was exposed.

On development with a 5 wt. % aqueous solution of lactic acid, no change was detected in the previously formed red-hued, green-hued and blue-hued colored portions while portions of the coating film corresponding to the largest light irradiation dose (400 mJ/cm$^2$) was selectively removed to expose the ITO film.

After washing with water and drying, electrodeposition was carried out for 3 minutes under the condition of d.c. voltage of 25 V at 25° C., using the glass substrate as an anode and a stainless steel beaker containing the colored coating (C-7) as a cathode. After washing the glass substrate with deionized water and drying the substrate at 80° C. for 5 minutes, no change was detected in the previously formed red-hued, green-hued and blue-hued colored portions while a black pattern which showed no tackiness at room temperature and had a film thickness at room temperature and had a film thickness of 2.5 μm was selectively formed on the portions where the ITO film was exposed.

The patterns were heated at 165° C. for 30 minutes for complete curing. The film thickness of the colored patterns was respectively 2.5 μm and a color filter which is excellent in transparency and has uniform colored layers was obtained.

EXAMPLE 5

A positive type photoresist (manufactured by TOKYO OHKA, a trade name "OFPR-800™") was applied by the aid of a spin coater onto a Pyrex glass substrate of 1.1 mm in thickness having on the surface thereof the ITO film of 80 nm in thickness, and the substrate was dried at 80° C. for 10 minutes to form a positive type photosensitive coating film of 2.5 μm in thickness.

Among pattern masks shown in FIG. 2A–C, a mask as shown in FIG. 2A was at the outset intimately contacted with the coating film and irradiated with UV rays of 250 mJ/cm$^2$, employing the same UV exposure device as used in Example 1. Next, a mask as shown in FIG. 2B was closely contact with the coating film and irradiated with UV rays of 20 mJ/cm$^2$. Further, a mask as shown in FIG. 2C was closely contacted with the coating film and irradiated with UV rays of 80 mJ/cm$^2$. On development with a 0.35 wt. % aqueous solution of sodium hydroxide, portions of the positive type photosensitive coating corresponding to the largest light irradiation dose was selectively removed to expose the ITO film.

After washing with water and drying, electrodeposition was carried out for 3 minutes under the condition of d.c. voltage of 25 V at 28° C., using the glass substrate as an anode and a stainless steel beaker containing the colored coating (C-8) as a cathode. On washing the glass substrate with deionized water and drying the substrate at 110° C. for 10 minutes, a black pattern of 2.5 μm in thickness was selectively formed in portions where the ITO film was exposed.

Next, the substrate was developed with a 0.5 wt. % aqueous solution of sodium hydroxide, no change was detected in the black colored layer while portions of the coating film corresponding to the second largest light irradiation dose (80 mJ/cm$^2$) was selectively removed to expose the ITO film.

After washing with water and drying, electrodeposition was carried out for 3 minutes under the condition of d.c. voltage 25 V at 28° C., using the glass substrate as anode and a stainless steel beaker containing the colored coating (C-9) as a cathode. After washing the glass substrate with deionized water and drying the substrate at 110° C. for 10 minutes, it was found that no change existed in the previously formed black colored portion while a red-hued pattern of 2.5 μm in thickness was selectively formed in portions where the ITO film was exposed.

On development with a 0.75 wt. % aqueous solution of sodium hydroxide, no change was detected in the black-hued and red-hued colored layers while portions of the coating film corresponding to the third largest light irradiation dose (20 mJ/cm$^2$) were selectively removed to expose the ITO film.

After washing with water and drying, electrodeposition was carried out for 3 minutes under the condition of d.c. voltage of 25 V at 28° C., using the glass substrate as an anode and a stainless steel beaker containing the colored coating (C-10) as a cathode. After washing the glass substrate with deionized water and drying the substrate at 110° C. for 10 minutes, no change was detected at all in the previously formed black-hued and red-hued colored portions while a green-hued pattern of 2.5 μm in thickness was formed selectively in portions where the ITO film was exposed.

The substrate was irradiated over its whole surface with UV rays of 200 mJ/cm$^2$, washed with a 3.5 wt. % aqueous solution of tetramethylammonium hydroxide to remove any remaining positive type photosensitive coating film, washed with water and dried to expose the ITO film.

After washing with water and drying, electrodeposition was carried out for 3 minutes under the condition of d.c. voltage of 25 V at 25° C., using the glass substrate as an anode and a stainless steel beaker containing the colored coating (C-11) as a cathode. After washing the glass plate with deionized water and drying the substrate at 110° C. for 10 minutes, no change was detected in the previously formed black-hued, red-hued and green-hued colored portions while a blue-hued pattern which had a film thickness of 2.5 μm was selectively formed on the portions where the ITO film was exposed.

The patterns were heated at 180° C. for 30 minutes for complete curing. The film thickness of the colored patterns was respectively 2.3 μm and a color filter which was excellent in transparency and had a uniform colored layers was obtained.

The present invention has been illustrated in connection with its preferred embodiments, but it is to be construed that many widely modifications and alterations may be made by those skilled in the art without departing from the spirit of the invention. Accordingly, the above disclosures are to be understood only for illustration and the present invention is not limited except as defined in the appended claims.

What is claimed is:

1. A method for producing a color filter comprising the steps of:

(A) forming a negative photoresist film on a transparent substrate having a transparent electrically conductive layer on the surface thereof and exposing the film separately through at least two negative pattern masks in such manner that a different light irradiation dose is supplied to the photoresist through each pattern mask, to thereby form at least two pattern regions and (B) performing an operation of developing the photoresist film and of applying a liquid colored coating by electrodeposition onto the electrically conductive layer to form a colored layer followed by repeating said operation successively for the respective pattern regions in the order in which the light irradiation dose increases.

2. A method for producing a color filter comprising the steps of:

(A') forming a positive photoresist film on a transparent substrate having a transparent electrically conductive layer on the surface thereof and exposing the film separately through at least two positive pattern masks in such manner that a different light irradiation dose is supplied to the photoresist through each pattern mask, to thereby form at least two pattern regions and (B') performing an operation of developing the photoresist film and of applying a liquid colored coating by electrodeposition onto the electrically conductive layer to form a colored layer followed by repeating said operation successively for the respective pattern regions in the order in which the light irradiation dose decreases.

3. A method according to claim 1, wherein the transparent electrically conductive layer is selected from the group consisting of tin oxide, indium oxide, antimony oxide and a mixture thereof.

4. A method according to claim 1, wherein the negative photoresist is formed of a negative photoresist resin containing a resin possessing a film-forming capability and photosensitivity, a photopolymerization initiator and a solvent selected from the group consisting of an organic solvent and water.

5. A method according to claim 4, wherein the negative photoresist resin has a molecular weight of 500–10,000.

6. A method according to claim 4, wherein the negative photoresist resin is a prepolymer selected from the group consisting of epoxy (meth)acrylate, urethane (meth)acrylate, polyester (meth)acrylate and a mixture thereof.

7. A method according to claim 4, wherein the negative photoresist resin is a cationic resin prepared by introducing a photosensitive group and a group selected from the group consisting of an amino group, an ammonium group, a sulfonium group and a mixture thereof into a main resin and treating the resin with an acidic material, the main resin being selected from the group consisting of acrylic resin, epoxy resin, urethane resin, polybutadiene resin and a mixture thereof, the photosensitive group being selected from the group consisting of acryloyl group, methacryloyl group, cinnamoyl group and a mixture thereof, the acidic substance being selected from the group consisting of formic acid, acetic acid, propionic acid, lactic acid and a mixture thereof.

8. A method according to claim 4, wherein the negative photoresist resin is a carboxylic group-containing anionic resin obtained by introducing a carboxyl group and a photosensitive group into a main resin and treating the resin with a basic substance, the main resin being selected from the group consisting of acrylic resin, polyester resin, maleinated oil resin, polybutadiene resin, epoxy resin and a mixture thereof, the photosensitive group being selected from the group consisting of acryloyl group, methacryloyl group, cinnamoyl group and a mixture thereof, and the basic substance being selected from the group consisting of triethylamine, diethylamine, dimethylethanolamine, ammonia and a mixture thereof.

9. A method according to claim 4, wherein the photopolymerization initiator is selected from the group consisting of benzoin, benzoin ether, benzylalkyl ketal, benzophenone, anthraquinone, thioxanthone and a mixture thereof.

10. A method according to claim 4, wherein the photopolymerization initiator is used in an amount of 0.1–30 parts by weight per 100 parts by weight of the negative photosensitive coating resin.

11. A method according to claim 4, wherein the organic solvent is selected from the group consisting of ethyleneglycol monobutyl ether, ethyleneglycol monohexyl ether, ethyleneglycol monophenyl ether, propyleneglycol monomethyl ether, propyleneglycol monophenyl ether, diethyleneglycol dimethyl ether, triethyleneglycol dimethyl ether, acetone, methyl ethyl ketone, methyl isobutyl ketone, cyclohexanone, isophorone, dibutyl ether, dioxane, tetrahydrofuran, methoxybutanol, diacetone alcohol, butanol, isopropanol, toluene, xylene, hexane, ethyl acetate, butyl acetate, 2-methoxyethyl acetate, 2-methoxypropyl acetate and a mixture thereof.

12. A method according to claim 4, wherein the negative photoresist resin contains a colorant selected from the group consisting of a dye and a pigment.

13. A method according to claim 12, wherein the dye is selected from the group consisting of azo dyes, anthraquinone dyes, benzodifuranone, condensed methine dyes, and a mixture thereof.

14. A method according to claim 12, wherein the pigment is selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, carbon black and a mixture thereof.

15. A method according to claim 12, wherein the colorant is contained in an amount of 3–70% by weight based on the total amount of the negative photoresist resin.

16. A method according to claim 2, wherein the positive photoresist is formed of a photosensitive coating resin containing resin having a film-forming capability and photosensitivity and a solvent selected from the group consisting of an organic solvent and water.

17. A method according to claim 16 wherein the positive photoresist resin is a quinone diazido group-containing cationic resin obtained by introducing a group selected from the group consisting of amino group, ammonium group, sulfonium group and a mixture thereof and a hydroxyl group into a main resin, adding a quinonediazidosulfonic acid compound to the resin by an esterification reaction and treating the resin with an acidic substance, the main resin being selected from the group consisting of acrylic resin, epoxy resin, urethane resin, polybutadiene resin, and a mixture thereof, and the acidic substance being selected from the group consisting of formic acid, acetic acid, propionic acid, lactic acid and a mixture thereof.

18. A method according to claim 16, wherein the positive photoresist resin is a quinonediazido group-containing anionic resin obtained by introducing a carboxyl group and a hydroxyl group into a main resin, adding a quinonediazidosulfonic acid compound to the resin by an esterification reaction and treating the resin with a basic substance, said main resin being selected from the group consisting of acrylic resin, polyester resin, maleinated oil resin, polybutadiene resin, epoxy resin, and a mixture thereof, and the basic substance being selected from the group consisting of triethylamine, diethylamine, dimethylethanolamine, ammonia and a mixture thereof.

19. A method according to claim 16, wherein said positive photoresist resin is a quinonediazido group-containing resin obtained by reacting a resin having film-forming capability and a hydroxyl group-containing compound with a quinonediazide compound, the quinonediazide compound being selected from the group consisting of a quinonediazide/sulfonic acid derivative-containing quinonediazide compound and an isocyanate group-containing quinonediazide compound.

20. A method according to claim 16, wherein said organic solvent is selected from the group consisting of ethyleneglycol monobutyl ether, ethylglycol monohexyl ether, ethyleneglycol monophenyl ether, propyleneglycol monomethyl ether, propyleneglycol monophenyl ether, diethyleneglycol dimethyl ether, triethyleneglycol dimethyl ether, acetone, methyl ethyl ketone, methyl isobutyl ketone, cyclohexanone, isophorone, dibutyl ether, dioxane, tetrahydrofuran, methoxybutanol, diacetone alcohol, butanol, isopropanol, toluene, xylene, hexane, ethyl acetate, butyl acetate, 2-methoxyethyl acetate, 2-methoxypropyl acetate, ethyl benzoate, dimethylformamide, N,N-dimethylacetoamide, dimethylsulfoxide and a mixture thereof.

21. A method according to claim 16, wherein the positive photoresist contains a colorant selected from the group consisting of a dye, a pigment and a mixture thereof.

22. A method according to claim 21, wherein the dye is selected from the group consisting of azo dyes, anthraquinone dyes, benzodifuranone dyes, condensed methine dyes and a mixture thereof.

23. A method according to claim 21, wherein the pigment is selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, carbon black and a mixture thereof.

24. A method according to claim 21, wherein 0.1 to 10 wt. % of the colorant is contained based on total weight of the positive photosensitive coating.

25. A method according to claim 1, wherein the step of exposing the film to a different light irradiation dose is selected from the group consisting of a method of varying the time of light exposure, a method of varying the distance for light exposure, and a method of varying the output of the light source, with or without holding the other two parameters of the group constant.

26. A method according to claim 1, wherein the exposing is effected so that the light irradiation dose has a difference of at least 5%.

27. A method according to claim 1, wherein a developing liquid for developing the photoresist is selected from the group consisting of acidic substances, basic substances, alcohols, glycol ethers, ketones and chlorinated hydrocarbons.

28. A method according to claim 1, wherein the colored coating is obtained by neutralizing a film-forming component and a colorant component with a material selected from the group consisting of an acidic substance and a basic substance, the film-forming component being selected from the group consisting of cationic resins and anionic resins and the colorant component being selected from the group consisting of a dye, a pigment and a mixture thereof.

29. A method according to claim 28, wherein the cationic resin is obtained by introducing a group selected from the group consisting of an amino group, ammonium group, sulfonium group and a mixture thereof into a main resin and treating the resin with an acidic substance, the main resin being selected from the group consisting of acrylic resin, epoxy resin, urethane resin, polybutadiene resin, and a mixture thereof and the acidic substance being selected from the group consisting of formic acid, acetic acid, propionic acid, lactic acid and mixture thereof.

30. A method according to claim 28, wherein the anionic resin is obtained by introducing a carboxyl group into a main resin, the main resin being selected from the group consisting of acrylic resin, polyester resin, maleinated oil resin, polybutadiene resin, epoxy resin, and a mixture thereof and the basic substance being selected from the group consisting of triethylamine, diethylamine, diethylethanol amine, ammonia and a mixture thereof.

31. A method according to claim 28, wherein the dye is selected from the group consisting of azo dyes, anthraquinone ayes, benzodifuranone dyes, condensed methine dyes and a mixture thereof.

32. A method according to claim 28, wherein the pigment is selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, carbon black and a mixture thereof.

33. A method according to claim 1, wherein the colored coating is electrodeposited at an electrical voltage of 5 to 500 V dc for a time interval of 5 to 300 seconds and at a liquid temperature of the colored coating of 10° to 35° C.

34. A method according to claim 1 further comprising a step of curing the colored layers by heating at 100° to 250° C. for 5 minutes to one hour after the step (B).

35. A method as claimed in claim 2 further comprising a step of curing the colored layers by heating at 100° to 250° C. for 5 minutes to one hour after the step (B').

36. A method according to claim 2, wherein the step of exposing the film to a different light irradiation dose is selected from the group consisting of a method of varying the time of light exposure, a method of varying the distance for light exposure, and a method of varying the output of the light source, with or without holding the other two parameters of the group constant.

37. A method according to claim 2, wherein the exposing is effected so that the light irradiation dose has a difference of at least 5%.

38. A method according to claim 2, wherein a developing liquid for developing the photoresist film is selected from the group consisting of acidic substances, basic substances, alcohols, glycol ethers, ketones and chlorinated hydrocarbons.

39. A method according to claim 2, wherein the colored coating is obtained by neutralizing a film-forming component and a colorant component with a material selected from the group consisting of an acidic substance and a basic substance, the film-forming component being selected from the group consisting of cationic resins and anionic resins and the colorant component being selected from the group consisting of a dye, a pigment and a mixture thereof.

40. A method according to claim 2, wherein the colored coating is electrodeposited at an electrical voltage of 5 to 500 V dc for a time interval of 5 to 300 seconds and at a liquid temperature of the colored coating of 10° to 35° C.

* * * * *